(12) United States Patent
McNeil et al.

(10) Patent No.: US 9,573,799 B2
(45) Date of Patent: Feb. 21, 2017

(54) MEMS DEVICE HAVING VARIABLE GAP WIDTH AND METHOD OF MANUFACTURE

(71) Applicant: FREESCALE SEMICONDUCTOR, INC., Austin, TX (US)

(72) Inventors: Andrew C. McNeil, Chandler, AZ (US); Yizhen Lin, Cohoes, NY (US); Lisa Z. Zhang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 257 days.

(21) Appl. No.: 14/290,297

(22) Filed: May 29, 2014

(65) Prior Publication Data

US 2014/0260616 A1    Sep. 18, 2014

Related U.S. Application Data

(62) Division of application No. 13/028,930, filed on Feb. 16, 2011, now Pat. No. 8,927,311.

(51) Int. Cl.
| | |
|---|---|
| *H01L 27/14* | (2006.01) |
| *B81B 3/00* | (2006.01) |
| *G01P 15/08* | (2006.01) |
| *G01P 15/125* | (2006.01) |
| *B81B 7/02* | (2006.01) |

(Continued)

(52) U.S. Cl.
CPC ............... *B81B 3/0056* (2013.01); *B81B 7/02* (2013.01); *G01P 15/0802* (2013.01); *G01P 15/125* (2013.01); *B81B 2201/0235* (2013.01); *B81B 2203/058* (2013.01); *B81B 2203/06* (2013.01); *G01P 2015/0831* (2013.01);

(Continued)

(58) Field of Classification Search
CPC .................. B81B 7/0006; B81B 7/008; B81B 2201/0235; B81B 2201/0242; B81B 3/0021; H01L 21/6835; H01L 2924/1461; H01L 22/34
See application file for complete search history.

(56) References Cited

U.S. PATENT DOCUMENTS

| | | |
|---|---|---|
| 7,121,141 B2 | 10/2006 | McNeil |
| 7,140,250 B2 | 11/2006 | Leonardson et al. |

(Continued)

OTHER PUBLICATIONS

European Patent Office, "Extended Search Report" Jun. 2, 2014; pp. 1-7; Europe.

*Primary Examiner* — Zandra Smith
*Assistant Examiner* — John M Parker
(74) *Attorney, Agent, or Firm* — Charlene R. Jacobsen

(57) ABSTRACT

A MEMS device (40) includes a base structure (42) and a microstructure (44) suspended above the structure (42). The base structure (42) includes an oxide layer (50) formed on a substrate (48), a structural layer (54) formed on the oxide layer (50), and an insulating layer (56) formed over the structural layer (54). A sacrificial layer (112) is formed overlying the base structure (42), and the microstructure (44) is formed in another structural layer (116) over the sacrificial layer (112). Methodology (90) entails removing the sacrificial layer (112) and a portion of the oxide layer (50) to release the microstructure (44) and to expose a top surface (52) of the substrate (48). Following removal, a width (86) of a gap (80) produced between the microstructure (44) and the top surface (52) is greater than a width (88) of a gap (84) produced between the microstructure (44) and the structural layer (54).

19 Claims, 4 Drawing Sheets

(51) Int. Cl.
    *H01L 21/66*      (2006.01)
    *H01L 21/683*     (2006.01)
(52) U.S. Cl.
    CPC .......... *H01L 21/6835* (2013.01); *H01L 22/34* (2013.01); *H01L 2924/1461* (2013.01); *Y10T 29/49156* (2015.01)

(56) References Cited

U.S. PATENT DOCUMENTS

| | | | |
|---|---|---|---|
| 7,578,190 B2 | 8/2009 | Lin et al. | |
| 7,610,809 B2 | 11/2009 | McNeil et al. | |
| 7,956,709 B2 | 6/2011 | Watanabe et al. | |
| 8,027,143 B2 | 9/2011 | Rijks et al. | |
| 8,238,074 B2 | 8/2012 | Steeneken | |
| 8,766,745 B1 * | 7/2014 | Kubena | H03H 3/0072 333/186 |
| 2003/0048036 A1 | 3/2003 | Lemkin | |
| 2006/0144143 A1 | 7/2006 | Gogoi et al. | |
| 2006/0273065 A1 | 12/2006 | Kim et al. | |
| 2008/0135998 A1 | 6/2008 | Witvrouw et al. | |
| 2009/0243063 A1 | 10/2009 | Yoon et al. | |
| 2010/0052082 A1 * | 3/2010 | Lee | B81B 7/0061 257/416 |
| 2012/0043627 A1 * | 2/2012 | Lin | B81B 7/02 257/415 |

\* cited by examiner

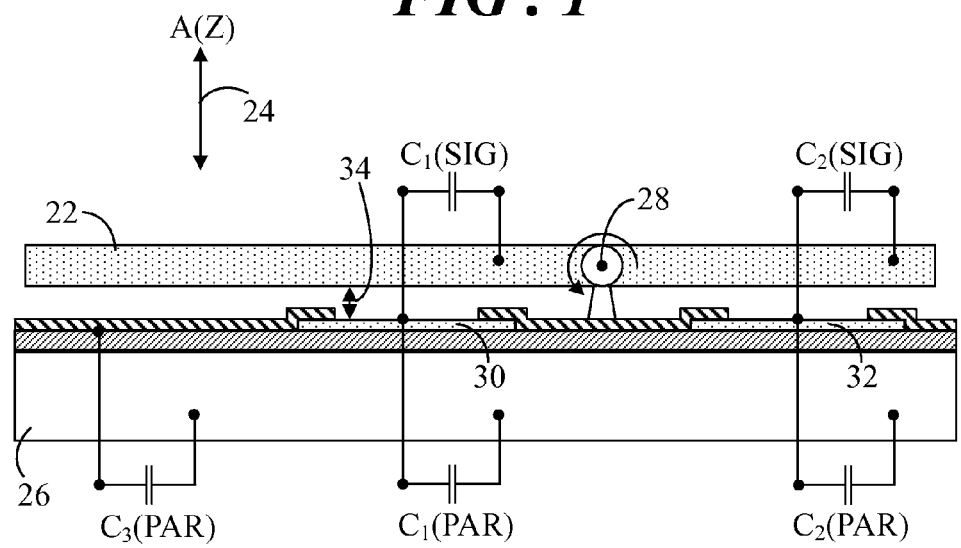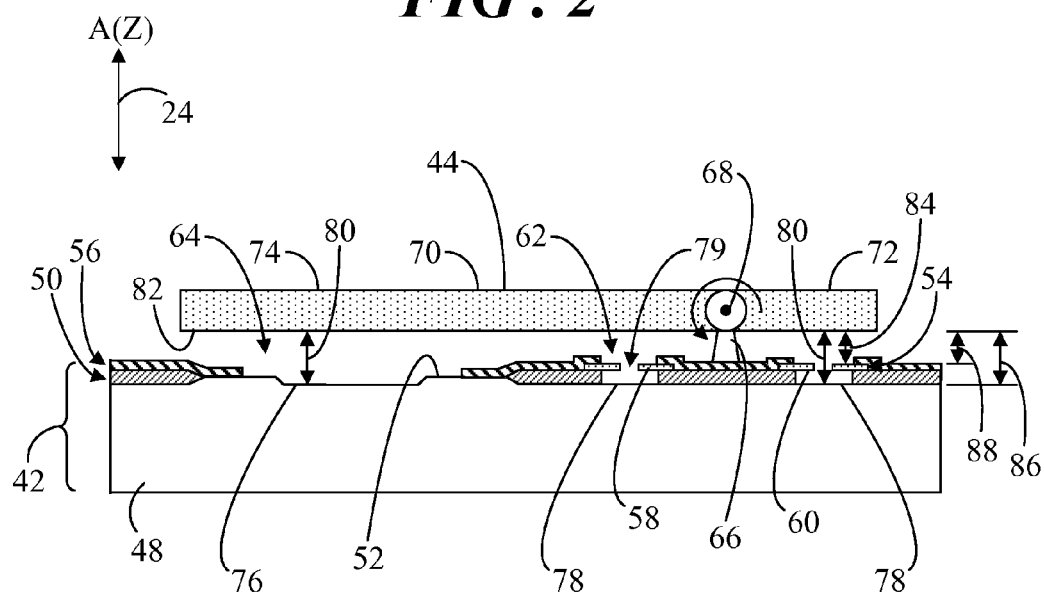

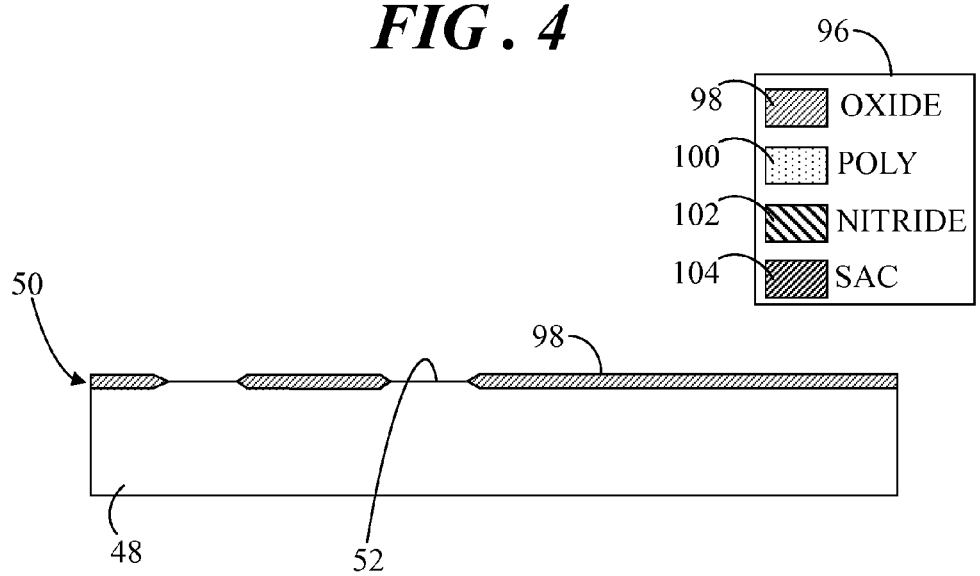
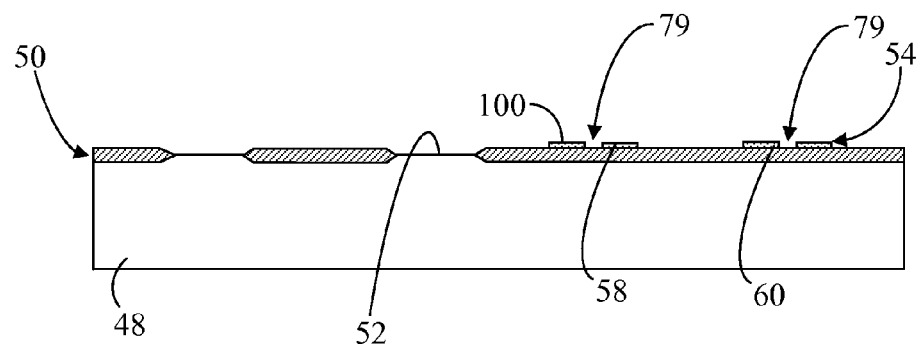
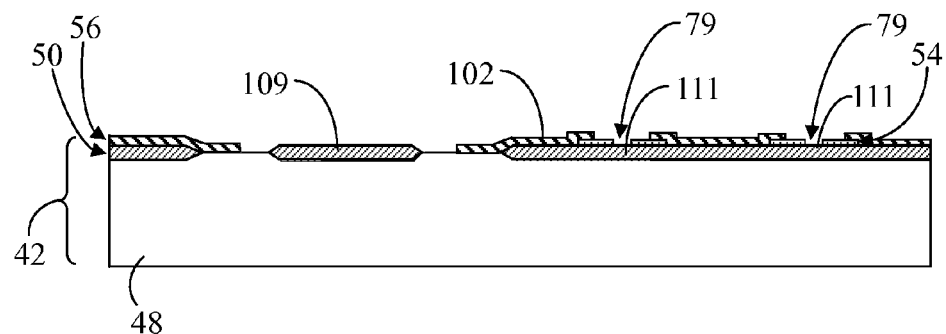

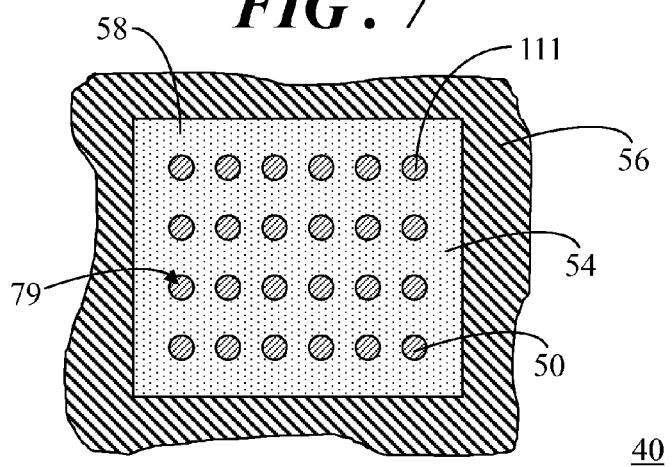
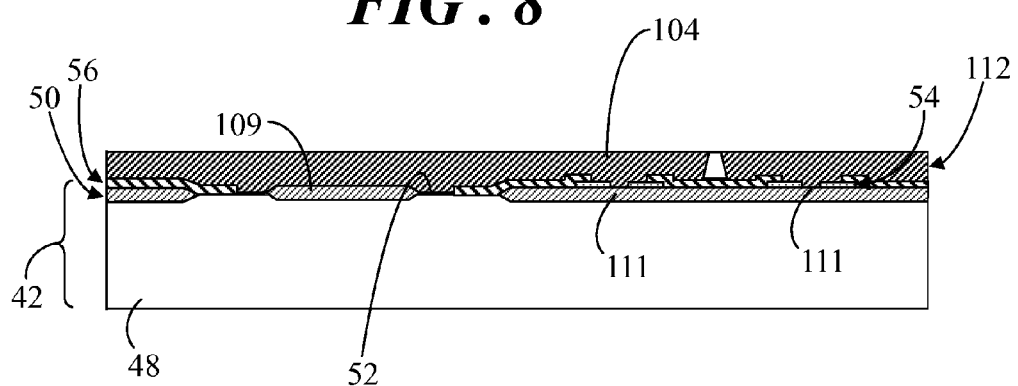
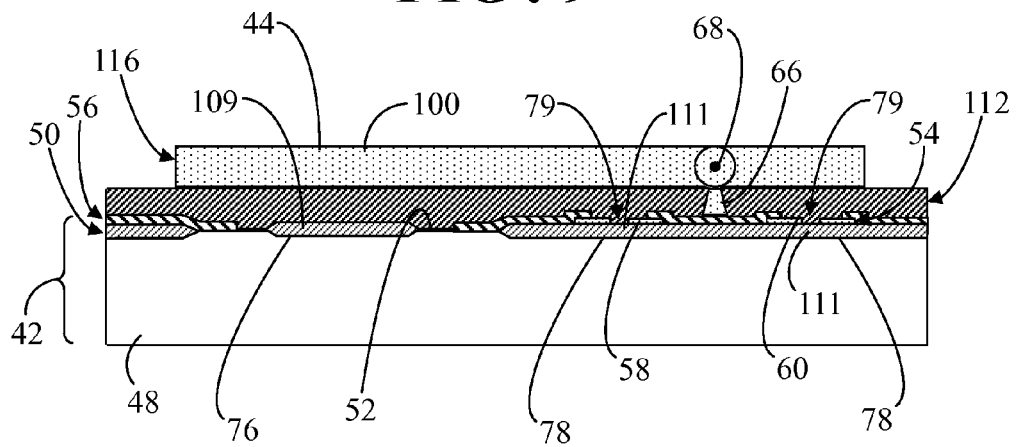

MEMS DEVICE HAVING VARIABLE GAP WIDTH AND METHOD OF MANUFACTURE

TECHNICAL FIELD OF THE INVENTION

The present invention relates generally to microelectromechanical systems (MEMS) devices. More specifically, the present invention relates to manufacturing MEMS devices having variable gap width between a suspended microstructure and underlying components.

BACKGROUND OF THE INVENTION

Microelectromechanical Systems (MEMS) devices are widely used in applications such as automotive, inertial guidance systems, household appliances, protection systems for a variety of devices, and many other industrial, scientific, and engineering systems. Such MEMS devices are used to sense a physical condition such as acceleration, pressure, or temperature, and to provide an electrical signal representative of the sensed physical condition.

Capacitive-sensing MEMS designs are highly desirable for operation in high acceleration environments and in miniaturized devices, due to their small size and suitability for low cost mass production. Conventional MEMS capacitive sensors operate so that a flexibly mounted seismic mass, also known as a proof mass, is deflectable in at least one direction by a property being sensed, e.g., acceleration. Deflection of the proof mass causes a change in capacitance of a differential circuit that is connected to it. This change in capacitance is a measure of the property being sensed.

FIG. 1 shows a side view of a portion of a prior art MEMS device 20. In this example, MEMS device 20 a two layer capacitive transducer having a "teeter-totter" or "see saw" configuration. This commonly utilized transducer type uses a movable proof mass 22 or plate that rotates under z-axis acceleration, represented by an arrow 24, above a substrate 26. This rotation occurs because an axis of rotation 28 is offset such that one end of proof mass 22 is heavier than the other end. The accelerometer structure can measure two distinct capacitances, represented by $C_1(SIG)$ and $C_2(SIG)$, between proof mass 22 and two sense plates 30 and 32 that are symmetrically located relative to axis of rotation 28 in order to determine differential or relative capacitance. A gap 34 is formed between proof mass 22 and each of sense plates 30 and 32 to provide space for the rotation of proof mass 22 about axis of rotation 28 and subsequent measurement of capacitances indicative of z-axis acceleration 24. In the illustrated embodiment, gap 34 is sometimes referred to as a "z gap" because gap 34 is formed between layers of structural material during processing and is thus in an out of plane direction relative to substrate 26.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a side view of a portion of a prior art MEMS device;

FIG. 2 shows a side view of a MEMS device in accordance with an embodiment;

FIG. 4 shows a schematic cross-sectional view illustrating an operation of the fabrication process of FIG. 3;

FIG. 5 shows a schematic cross-sectional view illustrating another operation of the fabrication process of FIG. 3;

FIG. 6 shows a schematic cross-sectional view illustrating another operation of the fabrication process of FIG. 3;

FIG. 7 shows a top view of a portion of the MEMS device illustrating openings extending through a sense plate;

FIG. 8 shows a schematic cross-sectional view illustrating another operation of the fabrication process of FIG. 3; and FIG. 9 shows a schematic cross-sectional view illustrating another operation of the fabrication process of FIG. 3.

DETAILED DESCRIPTION

Figure 3:
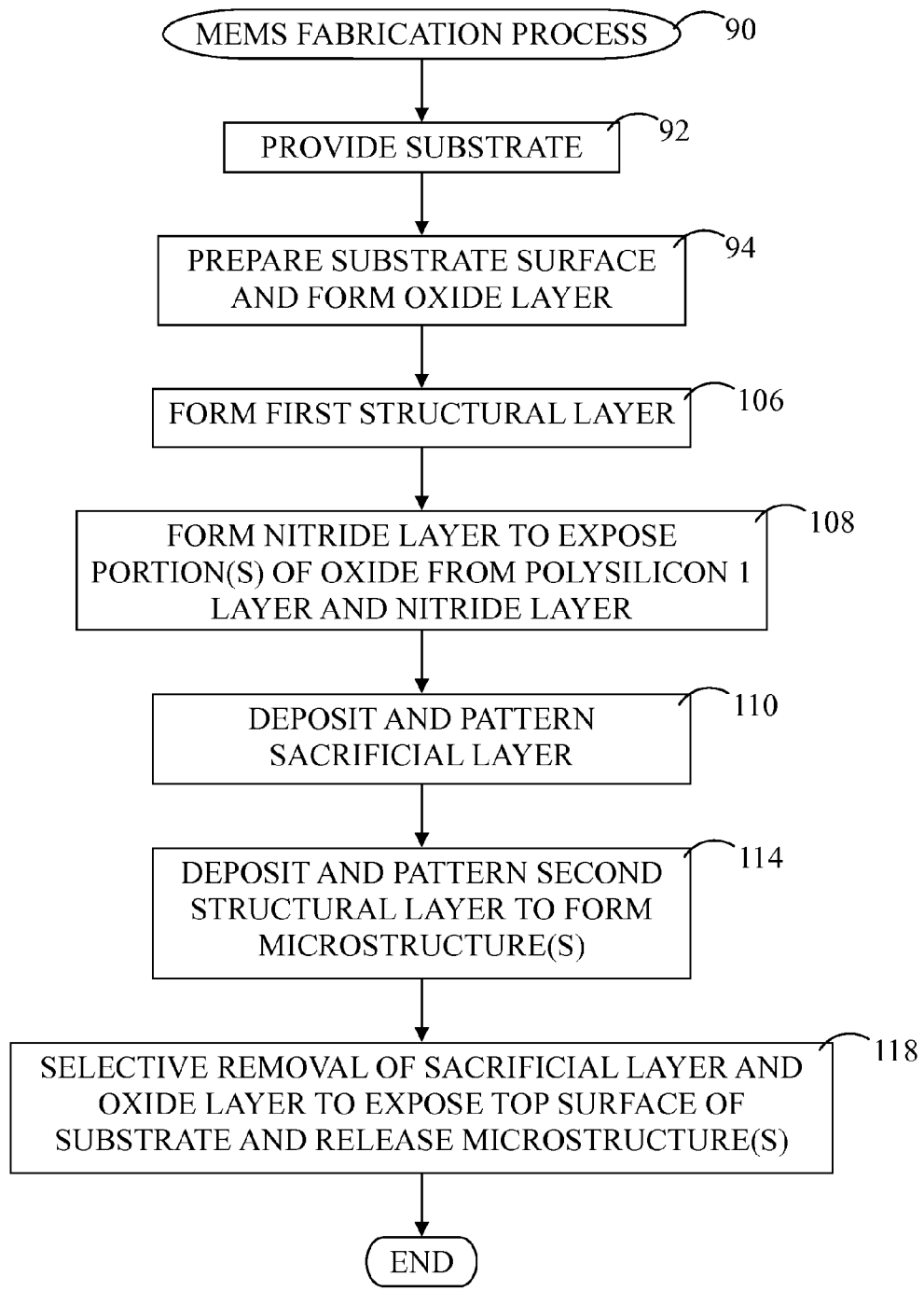
FIG. 3 shows a flowchart of a MEMS fabrication process for manufacturing the MEMS device of FIG. 2.

Embodiments of the invention entail a microelectromechanical systems (MEMS) device with enhanced noise reduction and reduced damping, and methodology for producing the MEMS device. The methodology produces a variable gap width between a base substrate structure and a microstructure of the MEMS device. This gap width is advantageously formed to be small at sense regions of the MEMS device and larger at non-sensing regions of the MEMS device in order to yield a desired sense capacitance while concurrently reducing parasitic capacitance and damping. The methodology is an adaptation of existing MEMS fabrication processes. Thus, implementation of the methodology can yield high performance and relatively low cost MEMS device architectures.

FIG. 2 shows a side view of a MEMS device 40 in accordance with an embodiment. MEMS device 40 includes a base structure 42 and a microstructure, in the form of a movable proof mass 44, suspended above base structure 42. The illustrated MEMS device 40 is an accelerometer configured to detect z-axis acceleration 24. However, principles of the invention are applicable to many other MEMS devices, such as gyroscopes, microactuators, pressure sensors, switches, and the so forth.

Base structure 42 includes a substrate 48 having a first dielectric layer, e.g., an oxide layer 50, formed on a top surface 52 of substrate 48. A first structural layer 54 is formed on oxide layer 50, and a second dielectric layer, e.g., an insulating layer 56, is formed over at least a portion of first structural layer 54, oxide layer 50, and/or top surface 52 of substrate 48. In an embodiment, first structural layer 54 is formed to define a first sense plate 58 and a second sense plate 60. First and second sense plates 58 and 60 represent a sense region 62 for MEMS device 40. The remaining area of base structure 42, exclusive of sense plates 58 and 60, represents a non-sensing region 64 of MEMS device 40. The terms "first," "second," and so forth used herein do not refer to an ordering or prioritization of elements within a countable series of elements. Rather, the terms "first," "second," and so forth are used to distinguish particular elements for clarity of discussion.

Proof mass 44 is anchored to base structure 42 via one or more flexures, generally represented by a simplified pedestal structure 66. As is known in the art, the flexures are designed to suspend proof mass 44 spaced apart from the underlying base structure 42 and to permit proof mass 44 to rotate under z-axis acceleration 24 about an axis of rotation 68 defined by pedestal structure 66. This rotation occurs because axis of rotation 68 is offset such that one side 70 of proof mass 44 is longer, and therefore heavier than, the opposing side 72 of proof mass 44.

Sense plates 58 and 60 are symmetrically located relative to axis of rotation 68, and the accelerometer structure of MEMS device 40 can measure two distinct capacitances between proof mass 44 and sense plates 58 and 60 in order to determine differential or relative capacitance. An extended section 74 of proof mass 44 that does not overlie sense plate 58 is located at non-sensing region 64 of MEMS device 40.

In an embodiment, selected regions of top surface 52 of substrate 48 are exposed from, i.e., not covered by, each of oxide layer 50, first structural layer 54, and insulating layer 56. In an embodiment, a first region 76 of top surface 52 of substrate 48 underlying extended section 74 of proof mass 44 is exposed. In addition, second regions 78 of top surface 52 of substrate 48 underlying sense plates 58 and 60 are exposed. In particular, sense plates 58 and 60 include openings 79 extending through sense plates 58 and 60. Oxide layer 50 is at least partially absent below sense plates 58 and 60. Accordingly, top surface 52 of substrate 48 at second regions 78 is exposed from oxide layer 50, first structural layer 54 and insulating layer 56 via openings 79.

The structure of MEMS device 40 yields a first gap 80 between a bottom surface 82 of proof mass 44 and top surface 52 of substrate 48 at each of first and second regions 76 and 78, respectively. Additionally, the structure of MEMS device 40 yields a second gap 84 between bottom surface 82 of proof mass 44 and each of sense plates 58 and 60 in first structural layer 54. Furthermore, a first width 86 of first gap 80 is greater than a second width 88 of second gap 84. Second width 88 of second gap 84 between sense plates 58 and 60 and proof mass 44 is kept small in order to provide the benefit of increased sense capacitance. First width 86 of first gap 80 between proof mass 44 and top surface 52 of substrate 48 is larger than second width 88 of second gap 84 to reduce the adverse affects of parasitic capacitance and undesirably high damping.

Parasitic capacitance is an unwanted capacitance that exists between the parts of an electronic component or circuit due at least in part to their proximity to each other. Referring briefly to FIG. 1, in MEMS device 20 some parasitic capacitance typically exists between sense plates 28 and 30 and the underlying substrate 26, as represented by $C_1(PAR)$ and $C_2(Par)$. Additionally, parasitic capacitance can exist between a non-sensing region, sometimes referred to as the heavy end, of proof mass 22 and the underlying substrate 26, as represented by $C_3(PAR)$. Undesirably high parasitic capacitance in MEMS device 20 reduces the accuracy of such a MEMS sensor.

With reference back to FIG. 2, the greater first width 86 of first gap 80 relative to second width 88 of second gap 84 reduces this parasitic capacitance. For example, the parasitic capacitance between sense plates 58 and 60 and the underlying substrate 48 is reduced because oxide layer 50 below sense plates 58 and 60 is replaced by a gas, e.g., air. Furthermore, the greater distance between proof mass 44 and substrate 48 in non-sensing region 64 underlying the extended section 74 of proof mass 44 can further reduce any parasitic capacitance.

The suspended movable proof mass structure of MEMS device 40 exhibits oscillations at some characteristic natural frequency. Damping is any effect that tends to reduce the amplitude of these oscillations. In MEMS device 20 (FIG. 1), a condition where there is too much damping can cause the frequency response to drop off too fast leading to reduced sensitivity. In addition, Brownian noise scales with damping. Brownian noise is signal noise produced by Brownian motion, and Brownian motion is the random thermally induced motion of small objects as a result of intermolecular collisions. In very light objects, such as MEMS devices, these collisions create signal noise, i.e., Brownian noise, even when the proof mass is in a stationary state. The greater distance between proof mass 44 and substrate 48 underlying the extended section 74 of proof mass 44 can reduce damping, correspondingly reducing Brownian noise, to increase sensor accuracy.

The damping ratio, i.e., a measure of the damping in an oscillatory system, for MEMS device 20 (FIG. 1) is not symmetrical. That is the damping ratio of a "+Z" z-axis acceleration 24 (FIG. 1), corresponding to a rotation in which the heavy end of proof mass 22 (FIG. 1) rotates closer to the underlying substrate 26 (FIG. 1) is typically larger than the damping ratio of a "−Z" z-axis acceleration 24, corresponding to a rotation in which the heavy end of proof mass 22 rotates farther away from substrate 26. In an embodiment, the greater distance between proof mass 44 and substrate 48 underlying the extended section 74 of proof mass 44 can reduce asymmetry in the damping ratio thus improving dynamic behavior on symmetry.

FIG. 3 shows a flowchart of a fabrication process 90 for producing MEMS device 40 (FIG. 2). Fabrication process 90 takes advantage of surface micromachining techniques to produce MEMS device 40 with variable gap widths. FIGS. 4-9 show various views representing operations of fabrication process 90. The operations of fabrication process 90 will be discussed in connection with FIGS. 4-9. As such, throughout discussion of the operations of fabrication process 90, reference will be made to particular ones of FIGS. 4-9.

Although a number of variations of the invention are possible, the basic process is illustrated in connection with FIGS. 2 and 4-9 which show the formation of first gap 80 between proof mass 44 and top surface 52 of substrate 48 at first and second regions 76 and 78. It should be understood however, that in alternative embodiments first gap 80 may be formed only at first region 76 or only at second regions 78 in accordance with device functionality.

Fabrication process 90 begins with a task 92. At task 92, substrate 48 is provided. In an embodiment, substrate 48 is a silicon wafer. However, since fabrication process 90 employs a surface micromachining technique in which the various layers of MEMS device 40 are built on top of substrate 48 and not inside it (such as in bulk micromachining), the substrate's properties are not as critical. Consequently, substrate 48 may alternatively be formed from a less costly electrically conductive material. The following operations of fabrication process 90 describe operations for fabricating a single MEMS device 40 (FIG. 2). However, in accordance with fabrication processes, a plurality of MEMS devices 40 may be produced on substrate 48 concurrently.

Fabrication process 90 continues with a task 94. At task 94, surface preparation of substrate 44 is performed and oxide layer 50 (i.e., the first dielectric layer) is formed. Referring to FIG. 4 in connection with task 94, FIG. 4 illustrates operations occurring at task 94 of fabrication process 90. A legend 96 is associated with FIG. 4. Legend 96 provides a list of the particular illustrative patterns used throughout FIGS. 2 and 4-9 to represent the various materials utilized in the fabrication of MEMS device 40. Thus, a first pattern 98 represents an oxide, such as silicon dioxide. A second pattern 100 represents polycrystalline silicon (usually referred to as polysilicon). A third pattern 102 represents a nitride, such as silicon nitride or silicon-rich nitride. A fourth pattern 104 represents a sacrificial material, such as an oxide. First and fourth patterns 98 and 104, respectfully, are nearly identical, other than their respective shading to represent that the material used can be the same, e.g., an oxide.

For clarity of description, oxide is referred to hereinafter as oxide 98. Likewise, polycrystalline silicon is referred to hereinafter as polysilicon 100. Nitride is referred to hereinafter as nitride 102, and the sacrificial material is referred to hereinafter as sacrificial oxide 104. Sacrificial oxide 104 is distinguished from oxide 98 to point out their similarities as an oxide and also to point out their differences in terms of deposition and patterning at different stages of fabrication of MEMS device 40.

At task 94 of process 90 and as represented by FIG. 4, fabrication begins with cleaning of substrate 48 and selective oxide growth through, for example, a LOCal Oxidation of Silicon (LOCOS) microfabrication process. In accordance with conventional LOCOS processes, following cleaning and surface preparation of substrate 48, a thermal field oxidation process is performed to produce oxide layer 50 of oxide 98 on top surface 52 of substrate 48. Per convention, oxide layer 50 need not be formed over an entirety of top surface 52, but may instead be grown in select regions, leaving the remainder of top surface 52 exposed from oxide 98 according to a particular mask pattern (not shown).

Oxide layer 50, sometimes referred to as a thermal oxide layer or a field oxide layer, of oxide 98 may have a thickness of approximately two to three microns. Growth of oxide layer 50 forms an immersed insulating barrier in which approximately one micron of the silicon substrate 48 is removed. As such, for a two micron thick oxide layer 50 grown on substrate 48, approximately one micron of oxide layer 50 extends above top surface 52 of substrate 48. Oxide layer 50 functions to limit cross-talk between active devices built on oxide layer 50. Although a thermal field oxidation process is discussed herein, it should be understood that other processes, such as patterned oxide deposition, may be used to produce oxide layer 50 in alternative embodiments. Furthermore, although the first dielectric layer is described as being an oxide layer, in alternative embodiments, another dielectric material may be implemented, such as a nitride.

Referring back to FIG. 3, following task 94, a task 106 is performed. At task 106, a first structural layer is deposited and patterned. Referring to FIG. 5 in connection with task 106, FIG. 5 illustrates operations occurring at task 106 of fabrication process 90. At task 106, polysilicon 100 is deposited over substrate 48 and oxide layer 50 to form first structural layer 54. Polysilicon 100 may be patterned using, for example, a photolithographic process, and etched using, for example, reactive ion etching (RIE), to produce patterned first structural layer 54. High conductivity is desired for first structural layer 54 in some embodiments. Hence, polysilicon 100 of first structural layer 54 may be doped over the entire surface area, or may otherwise be made highly conductive. After patterning and etching, first structural layer 54 can yield first and second sense plates 58 and 60 having openings 79.

With reference to FIG. 3, following task 106, a task 108 is performed. At task 108, a second dielectric layer, as a protective insulating layer, is deposited and patterned to yield base structure 42. Referring to FIG. 6 in connection with task 108, FIG. 6 illustrates operations occurring at task 108 of fabrication process 90. At task 108, nitride 102 is deposited over first structural layer 54 as well as any exposed portions of substrate 48 and oxide layer 50. Nitride 102 may be patterned using, for example, a photolithographic process, and etched using, for example, RIE, to produce the patterned second dielectric layer, i.e., insulating layer 56, in which some or all portions of top surface 52, substrate 48, oxide layer 50, and/or first structural layer 54 may be revealed. For example, a first portion 109 of oxide layer 50 is exposed from insulating layer 56 as well as first structural layer 54. Similarly, second portions 111 of oxide layer 50 are exposed from insulating layer 56 as well as first structural layer 54 via openings 79. Insulating layer 56 of nitride 102 insulates various regions of the underlying regions from one another.

FIG. 7 shows a top view of a portion of MEMS device 40 illustrating openings 79 extending through sense plate 58. Of course, the following discussion applies equally to sense plate 60. The deposition and patterning of first structural layer 54 to form sense plate 58 yields openings 79 extending through sense plate 58. Furthermore, the deposition and patterning of insulating layer 56 results in the exposure of sense plate 58 from insulating layer 56. As such, in the illustration, the underlying second portions 111 of oxide layer 50 are visible and therefore accessible via openings 79.

Referring back to FIG. 3, following task 108, a task 110 is performed. At task 110, a sacrificial oxide is deposited and patterned. FIG. 8 illustrates operations occurring at task 110 of fabrication process 90. At task 110, sacrificial oxide 104 is deposited over exposed top surface 52 of substrate 48, first and second portions 109 and 111 of oxide layer 50, first structural layer 54, and insulating layer 56 to form a sacrificial oxide layer 112. In an embodiment, sacrificial oxide layer 112 may be formed using, for example, a known tetraethyl orthosilicate (TEOS) deposition process. Once deposited, the TEOS is readily converted into silicon dioxide, i.e., sacrificial oxide 104. Sacrificial oxide layer 112 may be planarized and then patterned using, for example, a photolithographic process, and etched using, for example, an oxide wet etch process.

With reference back to FIG. 3, following deposition of sacrificial oxide layer 112 at task 110, a task 114 is performed. At task 114, a second structural layer is formed overlying sacrificial oxide layer 112. Referring to FIG. 9 in connection with task 114, FIG. 9 illustrates operations occurring at task 114 of fabrication process 90. At task 114, polysilicon 100 is deposited overlying the various structures and layers previously built up on substrate 48. A layer of polysilicon 100 may be formed using known and upcoming processes for polysilicon deposition. In one example, a polysilicon starting, or seed layer may be deposited over a surface of sacrificial oxide layer 112, and a thick silicon layer may then be deposited over the polysilicon starting layer in another process step. Following deposition, polysilicon 100 may be planarized using, for example, a chemical-mechanical polishing process to form a second structural layer 116 with a thickness of approximately twenty five microns. However, the final thickness of second structural layer 116 is determined by the application and desired sensitivity.

Following deposition, second structural layer 116 of polysilicon 100 is patterned and etched to yield a desired shape for the particular microstructures, such as proof mass 44, to be formed in second structural layer 116. Polysilicon 100 of second structural layer 116 may be patterned using, for example, a photolithographic process, and etched using, for example, reactive ion etching (RIE), to produce patterned second structural layer 116. Like first structural layer 54, high conductivity may be desired in some embodiments. Hence, polysilicon 100 of second structural layer 116 may be doped over the entire surface area, or may otherwise be made highly conductive. After patterning and etching, second structural layer 116 can yield proof mass 44 and the flexures, represented by pedestal structure 66, that will eventually enable movement of proof mass 44 about axis of rotation 68.

With continued reference to FIGS. 3 and 9, a task 118 is performed following task 114. At task 118, proof mass 44 is released and selected regions 76 and 78 of top surface 52 of substrate 48 are exposed. At task 118, a timed etch process may be performed to remove sacrificial oxide layer 112 as well as to remove first and second portions 109 and 111 of oxide layer 50 at first and second regions 76 and 78. In general, a timed etch is controlled by etch time, temperature, the particular etchant used, and the etchant concentration. In an embodiment, a suitable timed etch process may be implemented to remove sacrificial oxide layer 112 and to remove that first portion 109 of oxide layer 50 that is exposed from insulating layer 56 at first region 76. Concurrently, the timed etch process removes sacrificial oxide layer 112 and at least partially removes second portions 111 of oxide layer 50 underlying sense plates 58 and 60 via openings 79 in sense plates 58 and 60. That is, oxide layer 50 underlying sense plates 58 and 60 is undercut by the etchant passing through openings 79.

Referring back to FIG. 2, following selective removal of sacrificial oxide layer 112 and selected portions 109 and 111 of oxide layer 50 at task 114 (FIG. 3), proof mass 44 is released and is spaced apart from base structure 42. Accordingly, proof mass 44 is now movably suspended, as discussed above. In addition, first gaps 80 exhibiting first width 86 are produced between proof mass 44 and top surface 52 of substrate 48 at first and second regions 76 and 78, and second gaps 84 exhibiting second width 88 are produced between proof mass 44 and sense plates 58 and 60 in accordance with a particular design of MEMS device 40.

Embodiments described herein comprise a microelectromechanical (MEMS) device with enhanced noise reduction and reduced damping and methodology for producing the MEMS device. The methodology produces a variable gap width between a movable microstructure and selected underlying portions of a base substrate structure. This gap width is advantageously formed to be smaller at sense regions of the MEMS device and larger at non-sensing regions of the MEMS device in order to yield a desired sense capacitance while concurrently reducing parasitic capacitance and damping. The methodology is an adaptation of existing MEMS fabrication processes. Accordingly, the methodology can be readily implemented to yield high performance and low cost MEMS device architectures.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A microelectromechanical systems (MEMS) device comprising:
a base structure including a substrate having a first dielectric layer formed thereon, a first structural layer formed on said first dielectric layer, and a second dielectric layer formed over said first structural layer, wherein an exposed region of a top surface of said substrate is exposed from each of said first dielectric layer, said first structural layer, and said second dielectric layer; and
a proof mass suspended above said base structure to yield a first gap between said proof mass and said exposed region of said top surface of said substrate and a second gap between said proof mass and said first structural layer, a first width of said first gap being greater than a second width of said second gap.

2. The MEMS device of claim 1 wherein said exposed region is located at a non-sensing region for said MEMS device.

3. The MEMS device of claim 2 wherein said proof mass is adapted for motion relative to an axis of rotation, said axis of rotation being at a location that is displaced farther away from a first end of said proof mass than from a second end of said proof mass, a first section of said proof mass is delineated by said location of said axis of rotation and said first end and a second section of said proof mass is delineated by said location of said axis of rotation and said second end, said first section including an extended section spaced away from said location of said axis of rotation at a distance approximately equivalent to a length of said second section, and said exposed region underlies said extended section.

4. The MEMS device of claim 1 wherein said first structural layer comprises a sense plate underlying said proof mass, said sense plate being laterally displaced away from said exposed region of said top surface of said substrate.

5. The MEMS device of claim 4 wherein said sense plate includes openings extending through said sense plate, and a second exposed region of said top surface of said substrate underlies said sense plate, said second exposed region being exposed from said each of said first dielectric layer, said first structural layer, and said second dielectric layer via said openings.

6. The MEMS device of claim 1 wherein said first structural layer comprises a sense plate underlying said proof mass, said sense plate having openings extending through said sense plate, and wherein said exposed region of said top surface of said substrate underlies said sense plate, said exposed region being exposed from said each of said first dielectric layer, said first structural layer, and said second dielectric layer via said openings.

7. The MEMS device of claim 6 wherein said first dielectric layer is undercut below said sense plate about said openings.

8. The MEMS device of claim 6 wherein said sense plate is a first sense plate, and:
said proof mass is adapted for motion relative to an axis of rotation at a location between first and second ends of said proof mass, a first section of said proof mass is delineated by said location of said axis of rotation and said first end and a second section of said proof mass is delineated by said location of said axis of rotation and said second end, said first sense plate underlying said first section of said proof mass; and
said first structural layer further comprises a second sense plate underlying said second section of said proof mass, said second sense plate having said openings extending through said second sense plate, wherein a second exposed region of said top surface of said substrate underlies said second sense plate, and said second exposed region is exposed from said each of said first dielectric layer, said first structural layer, and said second dielectric layer via said openings extending through said second sense plate.

9. The MEMS device of claim 1 wherein said first dielectric layer is an oxide layer.

10. The MEMS device of claim 1 wherein said second dielectric layer is a nitride layer.

11. A microelectromechanical systems (MEMS) device comprising:
a base structure comprising:
a substrate having a first dielectric layer formed thereon;
a first structural layer formed on said first dielectric layer, said first structural layer including a sense plate, said sense plate having openings extending through said sense plate; and
a second dielectric layer formed over said first structural layer, wherein a first exposed region of a top surface of said substrate is located at a non-sensing region for said MEMS device, said first exposed region being exposed from each of said first dielectric layer, said first structural layer, and said second dielectric layer, and a second exposed region of said top surface of said substrate underlies said sense plate, said second exposed region being exposed from said each of said first dielectric layer, said first structural layer, and said second dielectric layer via said openings; and
a proof mass suspended above said base structure to yield a first gap between said proof mass and each of said first and second said exposed regions, and a second gap between said proof mass and said first structural layer, a first width of said first gap being greater than a second width of said second gap.

12. The MEMS device of claim 11 wherein said proof mass is adapted for motion relative to an axis of rotation, said axis of rotation being at a location that is displaced farther away from a first end of said proof mass than from a second end of said proof mass, a first section of said proof mass is delineated by said location of said axis of rotation and said first end and a second section of said proof mass is delineated by said location of said axis of rotation and said second end, said first section including an extended section spaced away from said location of said axis of rotation at a distance approximately equivalent to a length of said second section, and wherein said first exposed region underlies said extended section.

13. The MEMS device of claim 12 wherein:
said sense plate is a first sense plate;
said first sense plate underlies said first section of said proof mass; and
said first structural layer further comprises a second sense plate underlying said second section of said proof mass, said second sense plate having said openings extending through said second sense plate, wherein a third exposed region of said top surface of said substrate underlies said second sense plate, and said third exposed region is exposed from said each of said first dielectric layer, said first structural layer, and said second dielectric layer via said openings extending through said second sense plate.

14. The MEMS device of claim 13 wherein said first gap is formed between said proof mass and said third exposed region.

15. The MEMS device of claim 13 wherein said first dielectric layer is undercut below each of said first and second sense plates about said openings.

16. A microelectromechanical systems (MEMS) device comprising:
a base structure comprising:
a substrate having a first dielectric layer formed thereon;
a first structural layer formed on said first dielectric layer, said first structural layer including a first sense plate and a second sense plate, wherein openings extend through each of said first and second sense plates; and
a second dielectric layer formed over said first structural layer, wherein a first exposed region of a top surface of said substrate underlies said first sense plate, and a second exposed region of said top surface of said substrate underlies said second sense plate, said first and second exposed regions being exposed from said each of said first dielectric layer, said first structural layer, and said second dielectric layer via said openings; and
a proof mass suspended above said base structure to yield a first gap between said proof mass and each of said first and second exposed regions of said top surface of said substrate and a second gap between said proof mass and said first structural layer, a first width of said first gap being greater than a second width of said second gap.

17. The MEMS device of claim 16 wherein said first dielectric layer is undercut below said each of said first and second sense plates about said openings.

18. The MEMS device of claim 16 wherein said first dielectric layer is an oxide layer.

19. The MEMS device of claim 16 wherein said second dielectric layer is a nitride layer.

* * * * *